United States Patent
Jia et al.

(10) Patent No.: US 10,217,662 B2
(45) Date of Patent: Feb. 26, 2019

(54) METHOD FOR PROCESSING INTERCONNECTION STRUCTURE FOR MINIMIZING BARRIER SIDEWALL RECESS

(71) Applicant: ACM Research (Shanghai) Inc., Shanghai (CN)

(72) Inventors: Zhaowei Jia, Shanghai (CN); Jian Wang, Shanghai (CN); Hui Wang, Shanghai (CN)

(73) Assignee: ACM Research (Shanghai) Inc., Shanghai (CN)

( * ) Notice: Subject to any disclaimer, the term of this patent is extended or adjusted under 35 U.S.C. 154(b) by 0 days.

(21) Appl. No.: 15/751,822

(22) PCT Filed: Aug. 12, 2015

(86) PCT No.: PCT/CN2015/086725
§ 371 (c)(1),
(2) Date: Feb. 9, 2018

(87) PCT Pub. No.: WO2017/024540
PCT Pub. Date: Feb. 16, 2017

(65) Prior Publication Data
US 2018/0240701 A1 Aug. 23, 2018

(51) Int. Cl.
*H01L 21/768* (2006.01)
*H01L 21/3213* (2006.01)
(Continued)

(52) U.S. Cl.
CPC .. *H01L 21/76865* (2013.01); *H01L 21/32135* (2013.01); *H01L 21/32139* (2013.01);
(Continued)

(58) Field of Classification Search
CPC ............... H01L 21/3213; H01L 21/768; H01L 21/32135; H01L 21/32139; H01L 21/7684;
(Continued)

(56) References Cited

U.S. PATENT DOCUMENTS 6,207,570 B1 * 3/2001 Mucha ............. H01L 21/02063
257/E21.31
8,598,039 B2 * 12/2013 Wang ................ H01L 21/02074
257/E21.303
(Continued)

FOREIGN PATENT DOCUMENTS

CN 102005407 A 4/2011
CN 103081066 A 5/2013
(Continued)

OTHER PUBLICATIONS

International Search Report of the International Searching Authority issued in PCT/CN2015/086725 dated Apr. 28, 2016 (5 pages).
(Continued)

*Primary Examiner* — Thanh T Nguyen
(74) *Attorney, Agent, or Firm* — Osha Liang LLP

(57) ABSTRACT

A method for processing an interconnection structure for minimizing barrier sidewall recess, comprises the following steps: step 1, remove a metal layer (408) to generate a uniform dishing value inside the recessed area (409), the uniform dishing value is generated to make sure that the top surface of the metal layer (408) in the recessed area (409) is aligned with the bottom surface of the hard mask layer (405), step 2, introduce noble-gas-halogen compound gas to remove a first barrier layer (406) on top surface and at least a portion of a second barrier layer (407) on sidewall by a gas phase chemical reaction process, the top surface of the second barrier layer (407) on sidewall is aligned with the bottom surface of the hard mask layer (405), step 3, intro-
(Continued)

duce oxidizing gas to generate a barrier surface oxide (411) on the top surface of the second barrier layer (407) on sidewall, a metal surface oxide (412) is generated at the same time, step 4, introduce noble-gas-halogen compound gas to remove hard mask layer (405) by a gas phase chemical reaction process, step 5, reduce or remove the metal surface oxide (412).

14 Claims, 17 Drawing Sheets

(51) Int. Cl.
  *H01L 21/311* (2006.01)
  *H01L 23/532* (2006.01)
(52) U.S. Cl.
  CPC .... *H01L 21/7684* (2013.01); *H01L 21/76843* (2013.01); *H01L 21/76877* (2013.01); *H01L 21/76883* (2013.01); *H01L 21/31144* (2013.01); *H01L 23/53238* (2013.01)
(58) Field of Classification Search
  CPC ......... H01L 21/76843; H01L 21/76865; H01L 2924/0002; H01L 21/76877; H01L 21/76883; H01L 21/31144; H01L 23/53238; H01L 21/02074; H01L 21/32115; H01L 21/67075; H01L 21/67069; H01L 21/76802; H01L 123/522; H01L 2924/00
  See application file for complete search history.

(56) References Cited

U.S. PATENT DOCUMENTS

| | | | |
|---|---|---|---|
| 9,496,172 | B2* | 11/2016 | Wang ................ H01L 21/32115 |
| 2004/0231795 | A1 | 11/2004 | Rajagopalan et al. |
| 2006/0276030 | A1* | 12/2006 | Wang ................ H01L 21/02068 |
| | | | 438/631 |
| 2009/0087981 | A1 | 4/2009 | Suzuki et al. |
| 2010/0227473 | A1 | 9/2010 | Matsuda et al. |

FOREIGN PATENT DOCUMENTS

| | | |
|---|---|---|
| CN | 103700615 A | 4/2014 |
| CN | 103839876 A | 6/2014 |
| WO | 2010/020092 A1 | 2/2010 |
| WO | 2014/082197 A1 | 6/2014 |

OTHER PUBLICATIONS

Written Opinion of the International Searching Authority issued in PCT/CN2015/086725 dated Apr. 28, 2016 (3 pages).

* cited by examiner

METHOD FOR PROCESSING INTERCONNECTION STRUCTURE FOR MINIMIZING BARRIER SIDEWALL RECESS

BACKGROUND OF THE INVENTION

1. Field of the Invention

The present invention generally relates to semiconductor manufacture, and more particularly relates to a method for processing an interconnection structure for minimizing barrier sidewall recess.

2. The Related Art

In semiconductor manufacturing process, along with the advance in IC manufacturing process and improvement in integration degree of chips, copper interconnection has replaced aluminum interconnection as the main tridimensional interconnection in VISI.

As the density of transistors increases, copper and low k dielectric materials gradually become the mainstream technology of interconnection structures. However, the integration of copper and low k dielectric materials has some technical problems to solve in a practical application, such as barrier sidewall recess problem. FIG. 1 shows the cross-sectional view of a typical interconnection structure, the metal layer above the barrier layer has been removed and a uniform dishing value has already generated. Referring to FIG. 1, from bottom to top, the interconnection structure includes a substrate 101, an isolation layer 102, a first dielectric layer 103, a second dielectric layer 104, a hard mask layer 105 and a barrier layer. The interconnection structure further comprises a metal layer 108 inside a recessed area 109. The first dielectric layer 103 is a low k dielectric layer, the barrier layer is used for preventing the metal from diffusing into the low k dielectric materials in the interconnection structure. And the barrier layer could be defined as a first barrier layer 106 on top surface and a second barrier layer 107 on sidewall. The top surface of the metal layer 108 divides the second barrier layer 107 on sidewall into two parts: the upper part and the lower part. Both the first barrier layer 106 on top surface and the upper part of the second barrier layer 107 on sidewall are exposed, but the lower part of the second barrier layer 107 on sidewall is not exposed. The exposed barrier layer of the interconnection structure shall be removed in the next step.

At present, CMP (chemical mechanical polishing) process is a conventional method for removing the barrier layer. However, the CMP process has several deleterious effects on the underlying structures of the interconnection structures because of the relatively strong mechanical force involved. Especially, when the k value of the dielectric materials increasingly reduces, the mechanical force may cause permanent damage to the dielectric materials. The dielectric materials may be scratched by the CMP process.

In order to overcome the disadvantages of the CMP process, a more advanced technology, the gas phase etching technology, is used for removing the barrier layer. The gas phase etching technology utilizes chemical gas to react with the barrier layer at a certain temperature and pressure. More about the gas phase etching details can refer to the patent application with the application number PCT/CN2008/072059. Because there is no mechanical stress generated during the whole etching process, so there is no damage to the low k dielectric materials. But with the continuous decrease of the line width, new barrier layer materials, such as cobalt, ruthenium are used instead of conventional barrier layer materials such as Ta, TaN, Ti, TiN, and the thickness of the barrier layer becomes thinner and thinner, both of which increase the difficulty of the gas phase etching. As shown in FIG. 2, during the gas phase chemical reaction process, if the end point control is not accurate, the second barrier layer 107 on sidewall may be over etched, and an undesired sidewall recess 110 will be generated between the dielectric layers and the metal layer 108. Once the second barrier layer 107 on the sidewall is over etched, the metal in the recessed areas 109 diffuses into the low k dielectric layer.

Referring to the FIG. 2, typically, the barrier layer is a layer of Ta and TaN, and the hard mask layer 105 is a layer of TiN. Both the exposed barrier layer and the hard mask layer 105 are removed in one gas phase chemical reaction process at a certain temperature. Since the gas phase chemical reaction process is isotropic, besides the etching rate of TiN is lower than the etching rate of TaN at this operating temperature, the second barrier layer 107 on sidewall will be over etched if the hard mask layer 105 is totally removed. When the gas phase chemical reaction process is over, the result shows that the top surface of the second barrier layer 107 on sidewall is much lower than the top surface of the metal layer 108. So the sidewall recesses 110 are formed, which may cause current leakage issue, and device life time will be shortened.

SUMMARY

The present invention provides a method for processing an interconnection structure for minimizing barrier sidewall recess. The method comprises the following steps: Step 1, remove a metal layer to generate a uniform dishing value inside the recessed area, the uniform dishing value is generated to make sure that the top surface of the metal layer in the recessed area is aligned with the bottom surface of the hard mask layer. Step 2, introduce noble-gas-halogen compound gas to remove a first barrier layer on top surface and at least a portion of a second barrier layer on sidewall by a gas phase chemical reaction process, the top surface of the second barrier layer on sidewall is aligned with the bottom surface of the hard mask layer. Step 3, introduce oxidizing gas to generate a barrier surface oxide on the top surface of the second barrier layer on sidewall, a metal surface oxide is generated at the same time. Step 4, introduce noble-gas-halogen compound gas to remove hard mask layer by a gas phase chemical reaction process. Step 5, reduce or remove the metal surface oxide.

As described above, the present invention introduces the oxidizing gas and generates barrier surface oxide on top surface of the second barrier layer on sidewall, to prevent the second barrier layer on sidewall from being over etched, thereby may improve or even overcome the barrier sidewall recess issues.

BRIEF DESCRIPTION OF THE DRAWINGS

The present invention will be apparent to those skilled in the art by reading the following description of embodiments thereof, with reference to the attached drawings, in which.

DETAILED DESCRIPTION OF EMBODIMENTS

For solving the technical problems in prior art, the present invention provides a method for processing an interconnection structure for minimizing barrier sidewall recess. The method is operated in a processing chamber, and the interconnection structure is located on a wafer surface.

FIG. 3 to FIG. 9 show the method and the interconnection structure according to embodiment one of the present invention.

Figure 1:
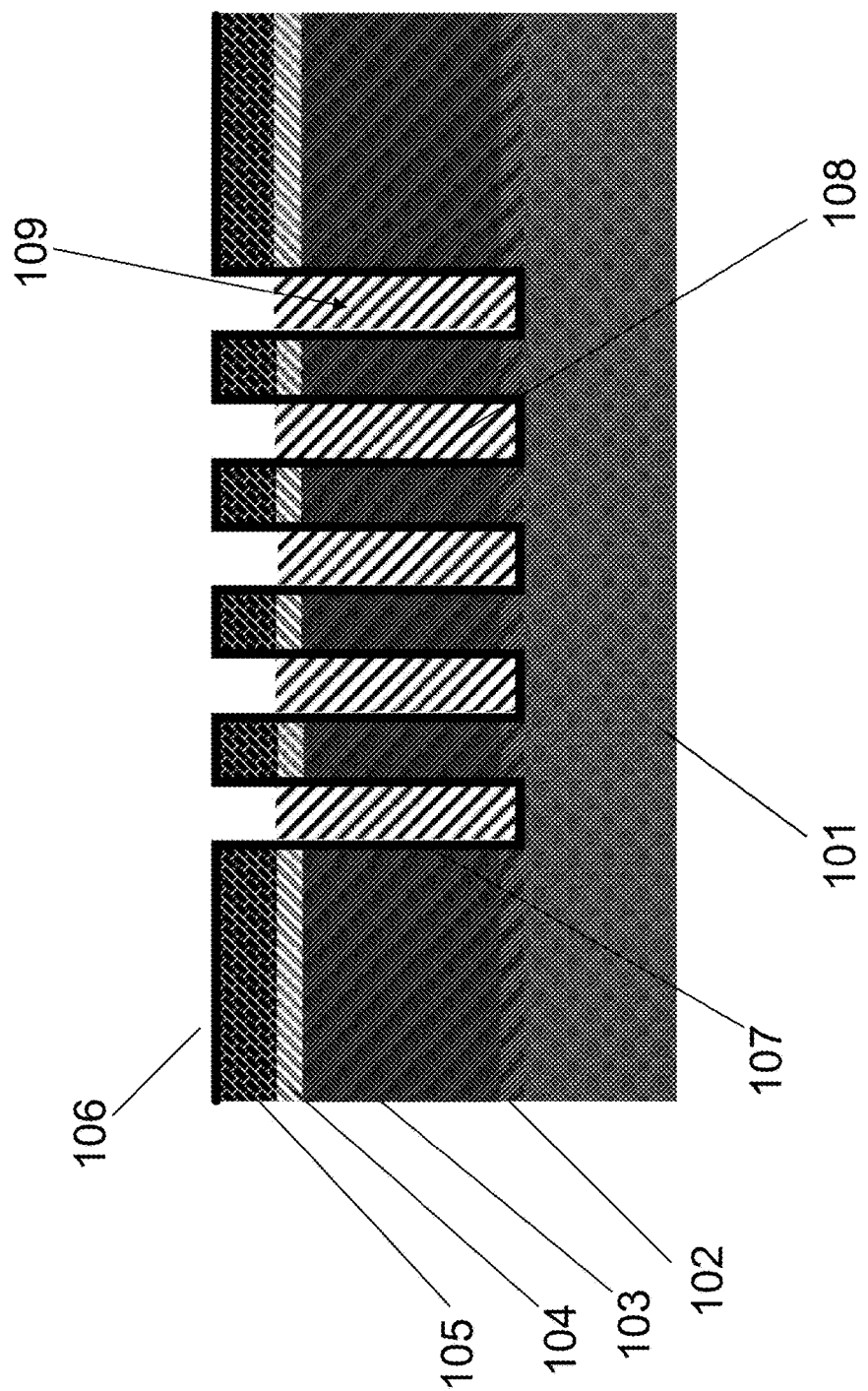
FIG. 1 is a cross-sectional view illustrating an interconnection structure in prior art.
Figure 2:
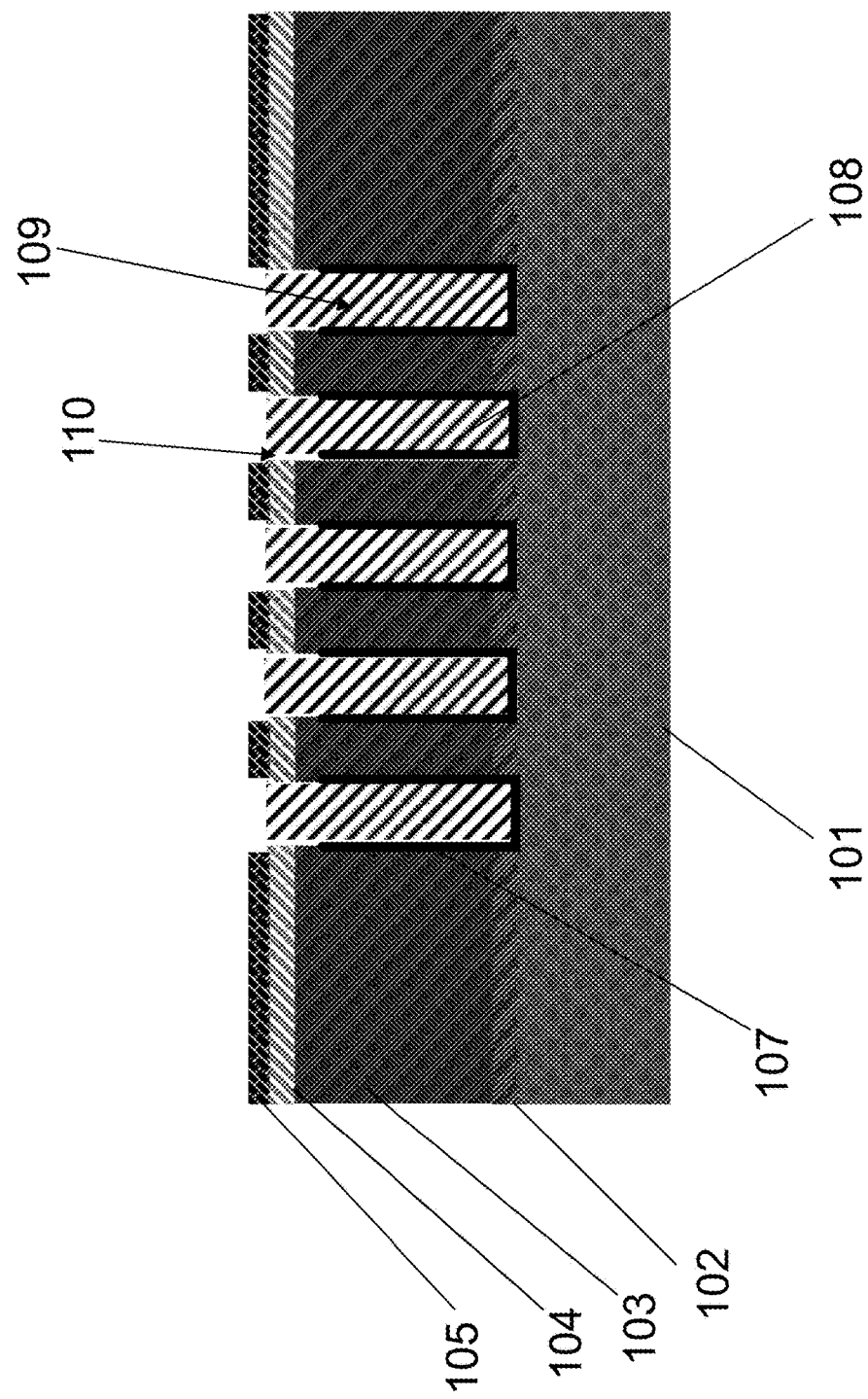
FIG. 2 is a cross-sectional view illustrating the barrier layer on sidewall of the interconnection structure shown in FIG. 1, which is over etched and the barrier sidewall recess is generated.
Figure 3:
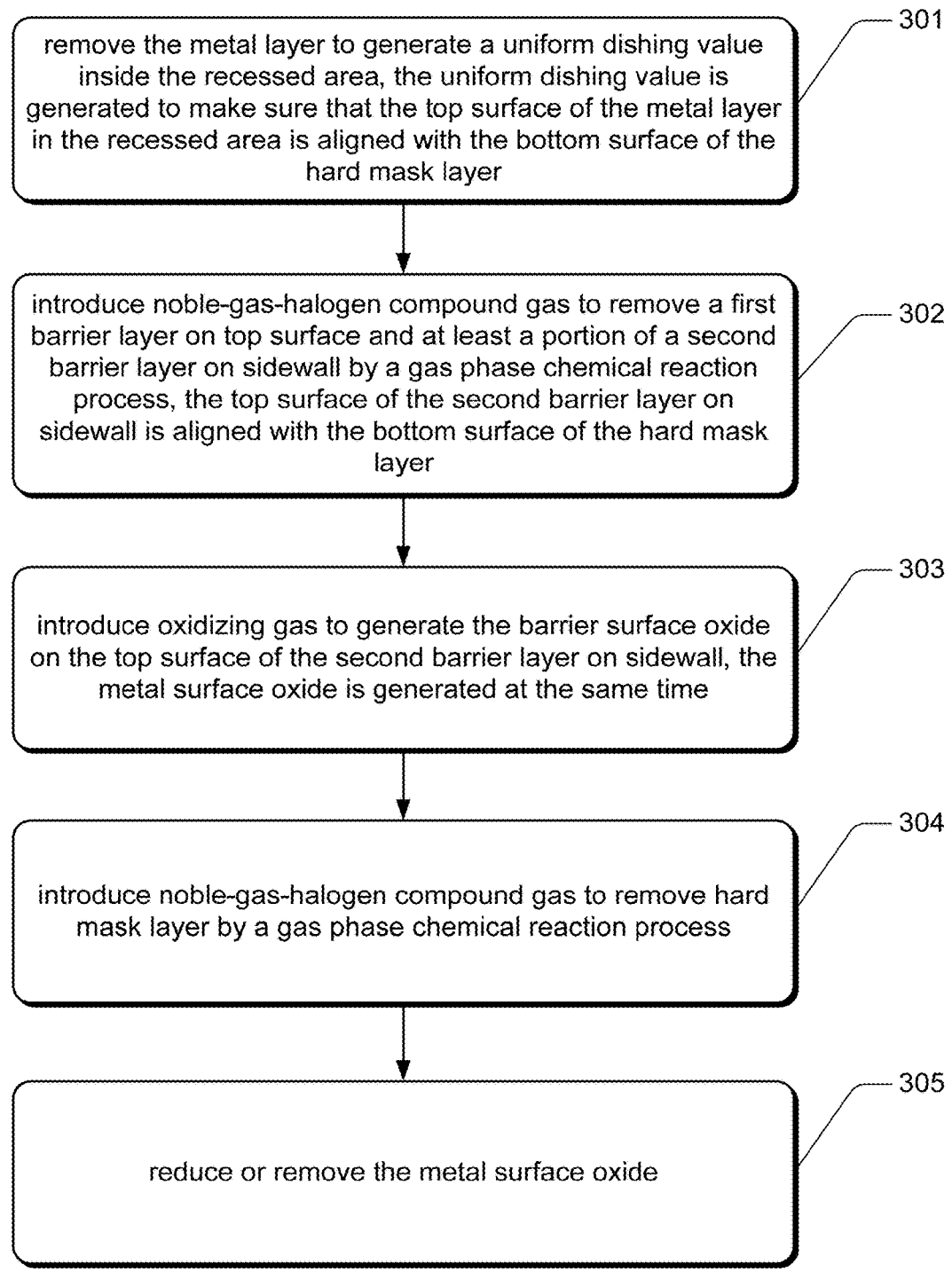
FIG. 3 is a flow chart illustrating the method according to embodiment one of the method for processing an interconnection structure for minimizing barrier sidewall recess.
Figure 4:
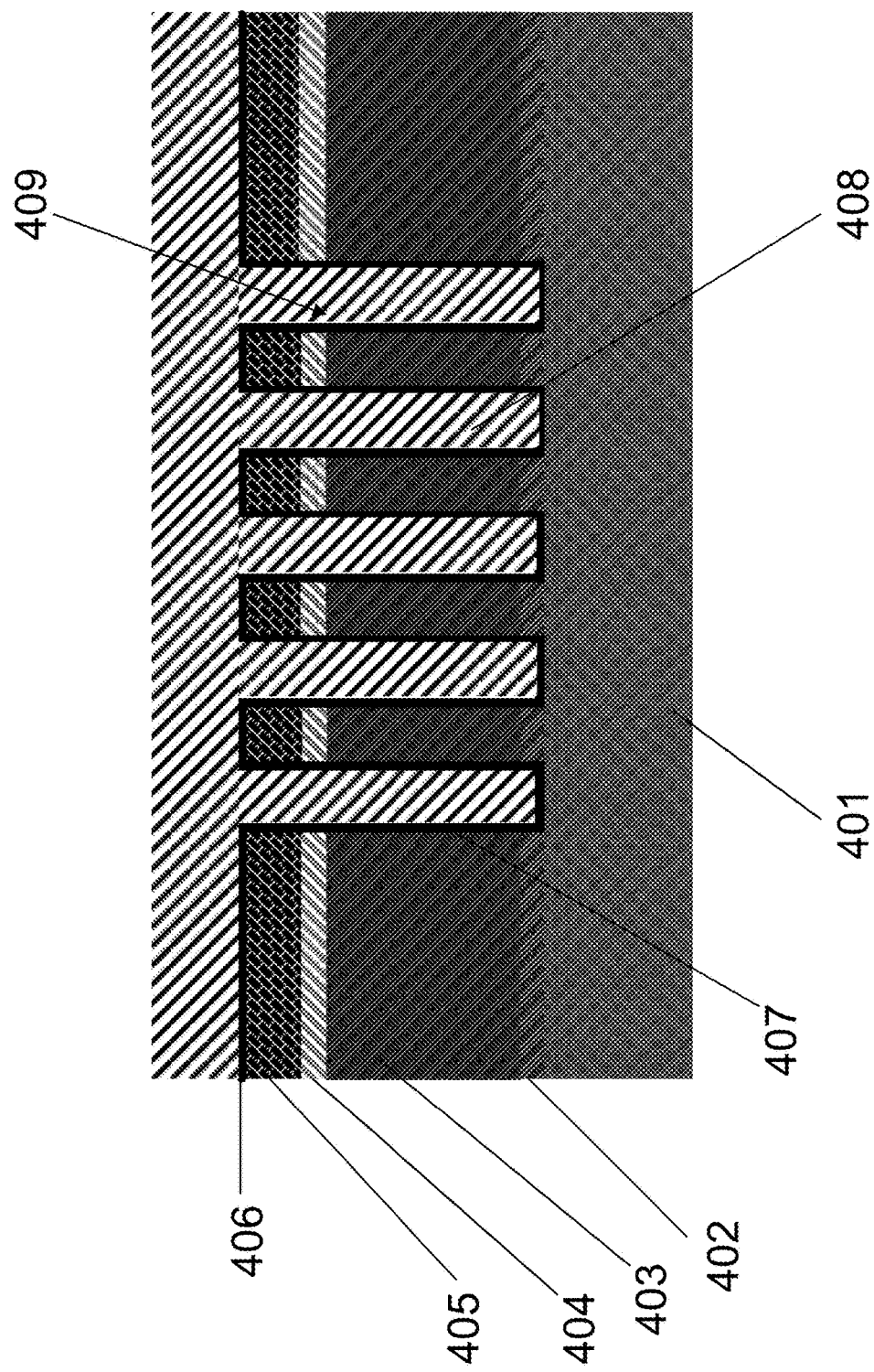
FIG. 4 is a cross-sectional view illustrating the interconnection structure according to embodiment one.

FIG. 3 is a flow chart illustrating the method for processing an interconnection structure for minimizing barrier sidewall recess. The method comprises the following steps:

Step 301: remove the metal layer 408 to generate a uniform dishing value inside the recessed area 409, the uniform dishing value is generated to make sure that the top surface of the metal layer 408 in the recessed area 409 is aligned with the bottom surface of the hard mask layer 405;

Step 302: introduce noble-gas-halogen compound gas to remove a first barrier layer 406 on top surface and at least a portion of a second barrier layer 407 on sidewall by a gas phase chemical reaction process, the top surface of the second barrier layer 407 on sidewall is aligned with the bottom surface of the hard mask layer 405;

Step 303: introduce oxidizing gas to generate the barrier surface oxide 411 on the top surface of the second barrier layer 407 on sidewall, the metal surface oxide 412 is generated at the same time;

Step 304: introduce noble-gas-halogen compound gas to remove hard mask layer 405 by a gas phase chemical reaction process;

Step 305: reduce the metal surface oxide 412;

FIG. 4 shows the cross-sectional view of the interconnection structure according to embodiment one. Referring to FIG. 4, from bottom to top, the interconnection structure includes a substrate 401, an isolation layer 402, a first dielectric layer 403, a second dielectric layer 404, a hard mask layer 405 and a barrier layer. The interconnection structure further comprises a metal layer 408 above the barrier layer and inside a recessed area 409. The first dielectric layer 403 is a low k dielectric layer. The second dielectric layer 404 is a layer of TEOS. And the barrier layer could be defined as a first barrier layer 406 on top surface and a second barrier layer 407 on sidewall. It is known that the barrier layer is used for preventing the metal from diffusing into the low k dielectric materials in the interconnection structure. The first barrier layer 406 on top surface and the second barrier layer 407 on sidewall are layers of Ru. In other embodiments, the material of the barrier layer could be Ta, WN, Co, TaN, etc. The hard mask layer 405 is a layer of TiN. The metal layer 408 above the barrier layer and inside the recessed area is a layer of Cu.

Figure 5:
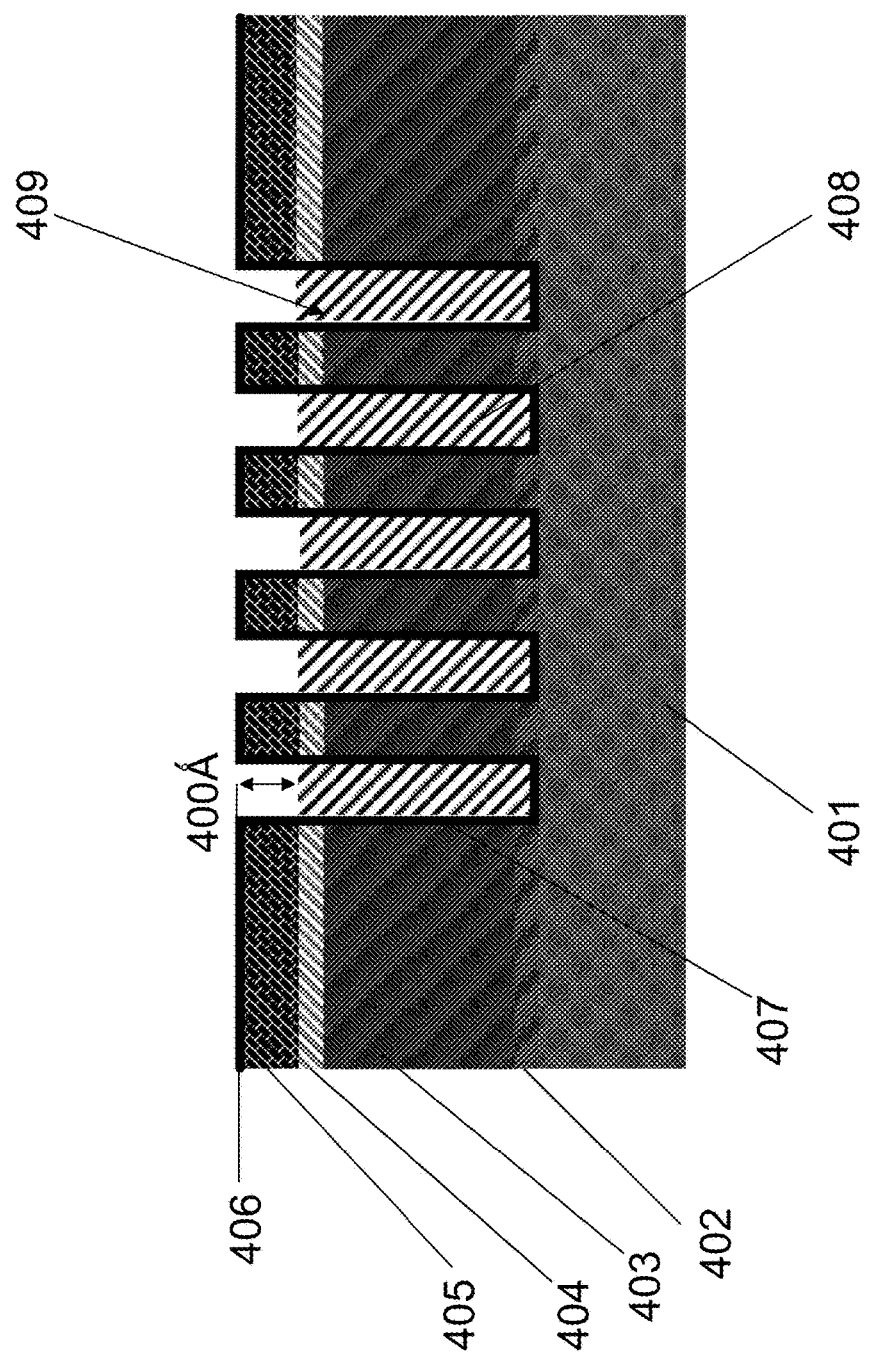
FIG. 5 is a cross-sectional view illustrating the interconnection structure according to embodiment one after the uniform dishing value is generated.

FIG. 5 is a cross-sectional view illustrating the interconnection structure after the uniform dishing value is generated. The metal layer 408 in the recessed area 409 is removed by SFP process in Step 301. SFP process is a stress free polishing process which use electro-polishing to remove Cu, so there is no damage to the low k layer. The metal layer 408 in the recessed area is removed by SFP process, but the barrier layer is not, so a uniform dishing value is generated inside the recessed area 409. This dishing value could be from 0 to 1000, depending on the thickness of the barrier layer and the hard mask layer. It is preferred that the top surface of the metal layer 408 in the recessed area 409 is aligned with the bottom surface of the hard mask layer 405. In this embodiment, the dishing value in each recessed area 409 is 400Å, and the top surface of the metal layer 408 in the recessed area 409 is aligned to the bottom surface of the hard mask layer 405. In other word, the top surface of the metal layer 408 in the recessed area 409 is aligned to the top surface of the second dielectric layer 404. Since the uniform dishing is generated, the second barrier layer 407 on sidewall is divided into two parts by the top surface of the rest of the meta layer 408: an upper part and a lower part. The upper part of the second barrier layer 407 on sidewall is exposed after SFP process, and the lower part of the barrier layer 407 on sidewall remains unexposed. So both the exposed barrier layer 406 on top surface and the exposed barrier layer 407 on sidewall need to be removed in the next step.

Figure 6:
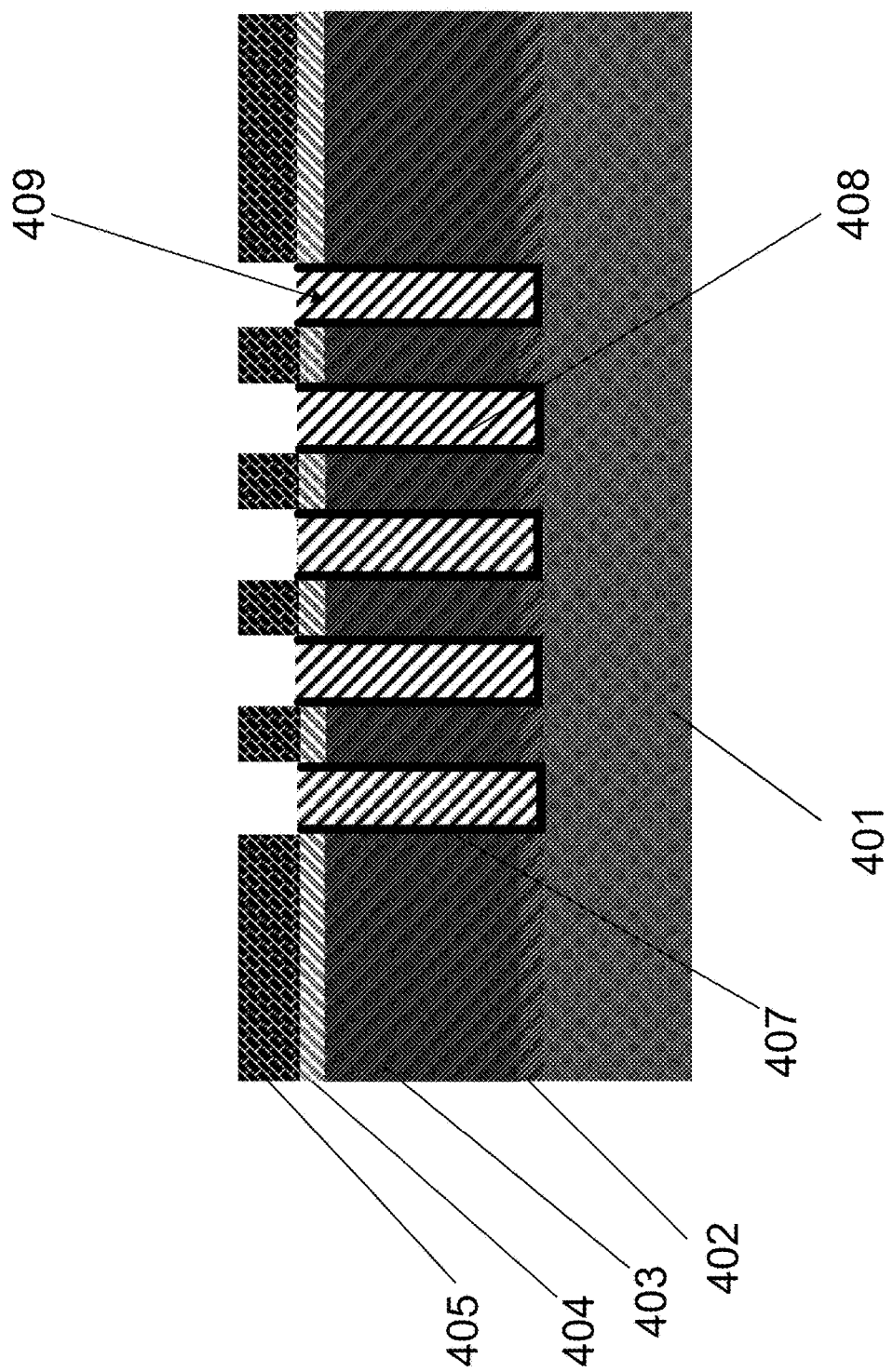
FIG. 6 is a cross-sectional view illustrating the interconnection structure according to embodiment one after the exposed barrier layer is removed.

FIG. 6 shows the exposed barrier layer 407 on sidewall and the exposed barrier layer 406 on top surface are removed by the gas phase chemical reaction process in step 302. In this embodiment, the thickness of the second barrier layer 407 on sidewall is aligned to the thickness of the first barrier layer 406 on top surface. Besides, the gas phase chemical reaction process is isotropic, so after the noble-gas-halogen compound gas is introduced to the processing chamber, the upper part of the second barrier layer 407 on sidewall will be removed, as well as the first barrier layer 406 on top surface. The first barrier layer 406 on top surface is totally removed after the gas phase chemical reaction process, so there is no barrier residual on the top surface of the hard mask layer 405. And the hard mask layer 405 is exposed after the gas phase chemical reaction process. In order to overcome the barrier sidewall recess problem, the gas phase chemical reaction process in Step 302 need to be controlled accurately by an end point control mechanism, so that the exposed second barrier layer 407 on sidewall is removed and the unexposed second barrier layer 407 on sidewall is aligned with the bottom surface of the hard mask layer 405. The end point control mechanism, for example, is to control the gas phase chemical reaction process by the length of time.

The process conditions of the gas phase chemical reaction process in Step 302 can be set as follows: the operating temperature is from RT (Room temperature) to 400° C., the gas flow rate of the noble-gas-halogen compound gas is from 2 sccm to 100 sccm, the operating pressure is from 5 mTorr to 20 Torr. And the noble-gas-halogen compound gas in Step 302 can be one of the following: $XeF_2$, $XeF_4$, $XeF_6$ or $KrF_2$. An inert gas, such as Ne or Ar, could also be introduced into the processing chamber with the noble-gas-halogen compound gas as a carrier gas.

In embodiment one, the process conditions of the gas phase chemical reaction process in Step 302 are as follows: the operating temperature is 110° C., the gas flow rate of the noble-gas-halogen compound gas is 6 sccm, the operating pressure is 4 Torr. The the noble-gas-halogen compound gas is $XeF_2$. It takes about 50 s to finish the gas phase chemical reaction process in Step 302 at these certain conditions. Since the $XeF_2$ doesn't react with neither Cu nor low k materials, the low k layer will not be damaged, and the electrical performance and the life time of the IC device will be enhanced.

Figure 7:
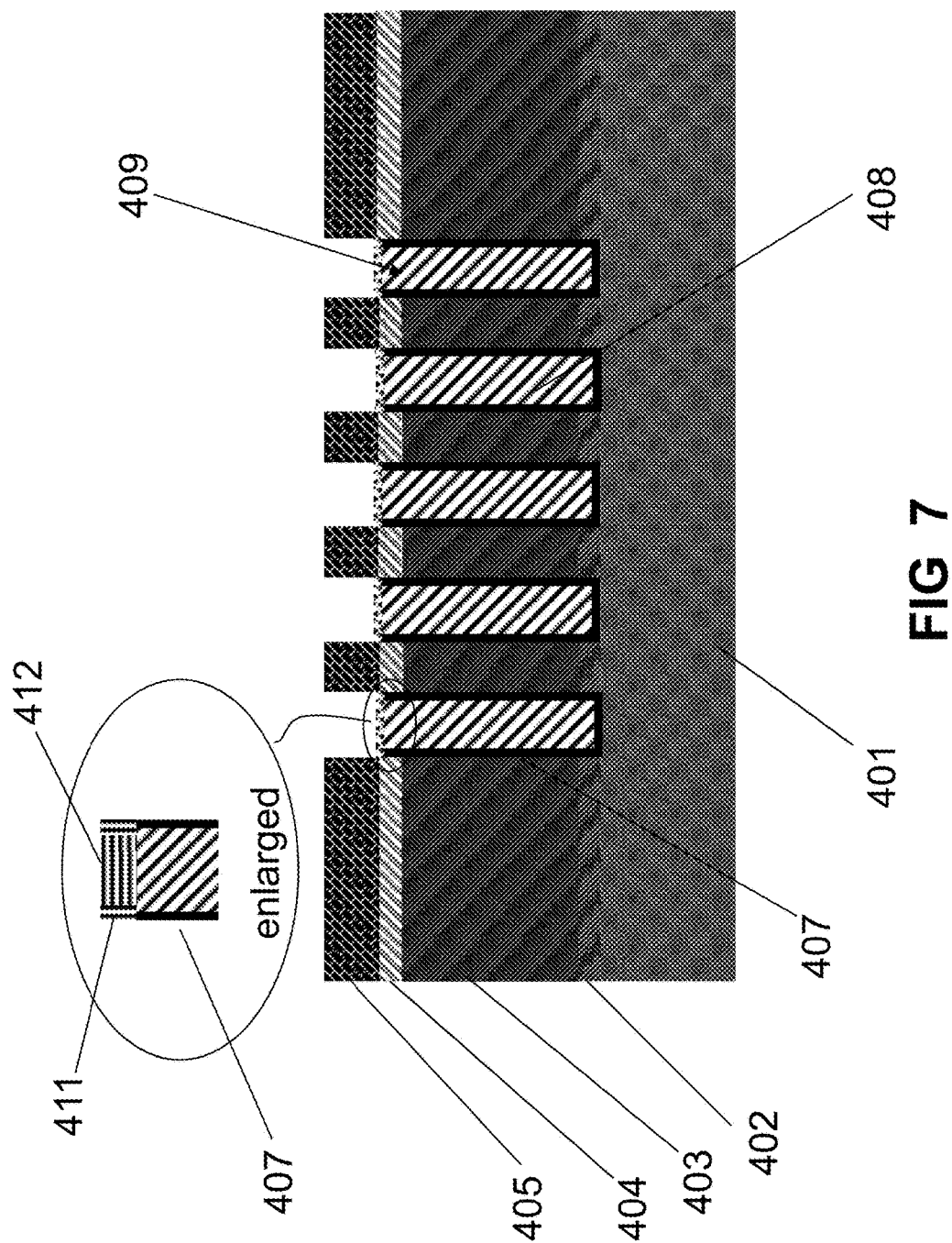
FIG. 7 is a cross-sectional view illustrating the interconnection structure according to embodiment one after the oxidizing gas is introduced.

Referring to FIG. 7. FIG. 7 is a cross-sectional view illustrating the interconnection structure after the oxidizing gas is introduced in Step 304. The oxidizing gas is $O_2$ in this embodiment. In Step 303, after the $O_2$ is introduced into the processing chamber, the top surface of the second barrier layer 407 on sidewall will be oxidized, as well as the top surface of the rest of the metal layer 408 in the recessed area 409. So the barrier surface oxide 411 is generated on top of the second barrier layer 407 on sidewall, and the metal surface oxide 412 is generated at the same time. Both the barrier surface oxide 411 and the metal surface oxide are very thick. The barrier surface oxide 411 is conductive to prevent the second barrier layer 407 on sidewall from being further etched in the next step, so that the barrier sidewall recess will not be generated. The metal surface oxide 412 is copper surface oxide which is undesired, so it will be processed in subsequent steps.

In Step 303, the $O_2$ can be introduced at conditions of the following: the operating temperature is from 150° C. to 400° C., the gas flow rate of the $O_2$ is from 0.1 to 20 slm, the operating pressure is from 200 Torr to 800 Torr. The operating temperature is important, because there will be no obvious oxidization occurring on the barrier layer if the operating temperature is lower than 150° C. What's more, if the operating temperature is higher than 400° C., the interconnection structure will be damaged by thermo stress. Meanwhile, the oxidization threshold temperature of TiN is 800° C., so the hard mask layer 405 will not be oxidized at current conditions. In this embodiment in Step 303, the $O_2$ is introduced at conditions of the following: the operating temperature is 180° C., the gas flow rate of the $O_2$ is 20 slm, the operating pressure is 1 atm, and the process time is 60 s.

Figure 8:
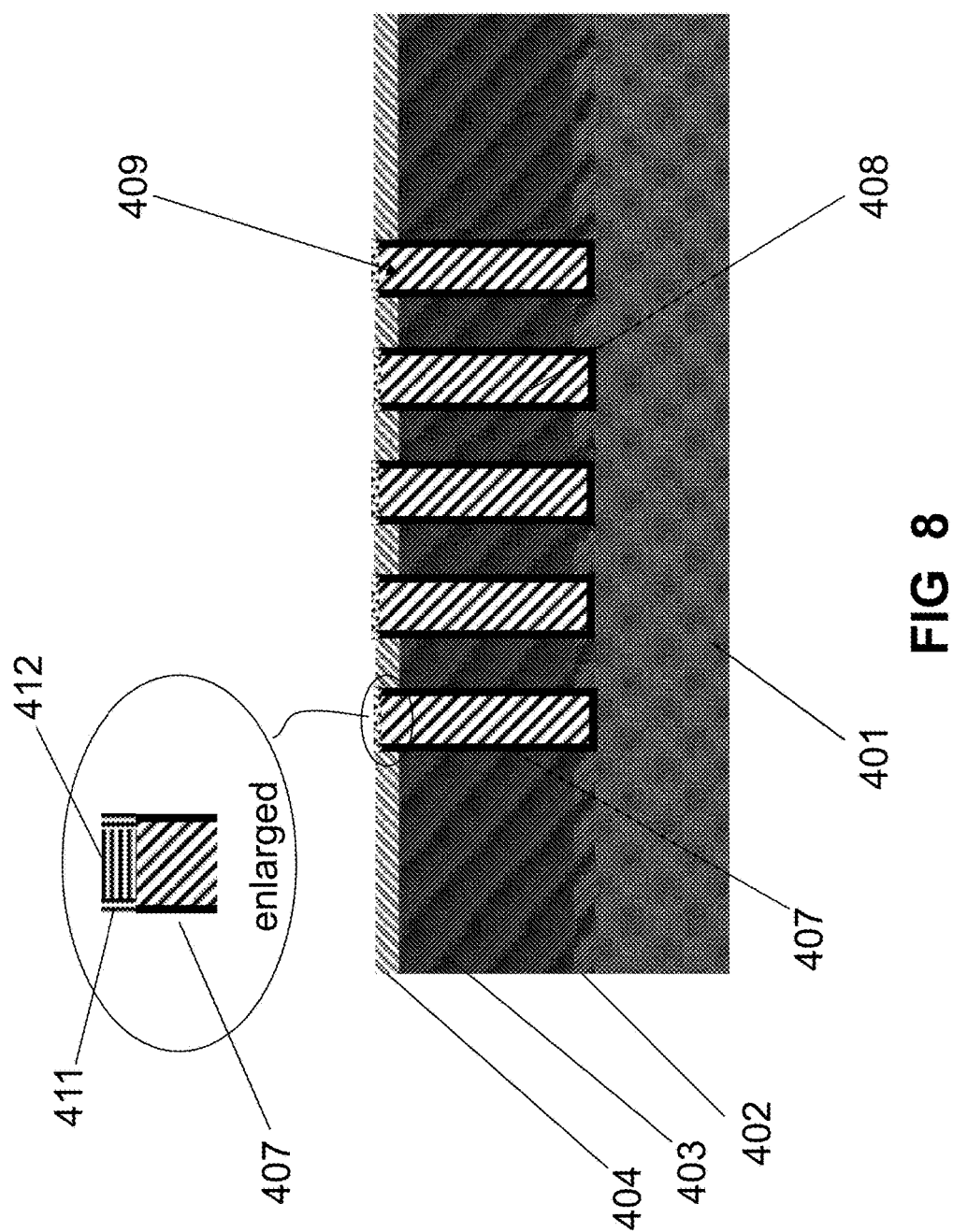
FIG. 8 is a cross-sectional view illustrating the interconnection structure according to embodiment one after the hard mask layer is removed.

FIG. 8 is a cross-sectional view illustrating the interconnection structure in embodiment one after the hard mask layer 405 is removed in Step 304 In Step 304, noble-gas-halogen compound gas is introduced into the processing chamber to remove the hard mask layer 405. The noble-gas-halogen compound gas is $XeF_2$. Since the top surface of the barrier layer 407 on sidewall is protected by the barrier surface oxide 411, and the hard mask layer 405 of TiN is not oxidized, so in the end of the gas phase chemical reaction process in Step 304, only the hard mask layer 405 will be removed by $XeF_2$. The second barrier layer 407 on sidewall is not further etched in the gas phase chemical reaction process in Step 304, so that the barrier sidewall recess problem is avoided.

According to the experimental data, there is a positive correlation between the etching rate of TiN and temperature. Therefore, in order to achieve a better effect and etching efficiency, the processing conditions in the gas phase chemical reaction process in Step 304 are a little different from the gas phase chemical reaction process in Step 302. The processing conditions in the gas phase chemical reaction process in Step 304 are as follows: the operating temperature is from 150° C. to 400° C., the gas flow rate of the noble-gas-halogen compound gas is from 2 sccm to 100 sccm, the operating pressure is from 5 mTorr to 20 Torr. An inert gas, such as Ne or Ar, could also be introduced into the processing chamber with the noble-gas-halogen compound gas as a carrier gas.

Figure 9:
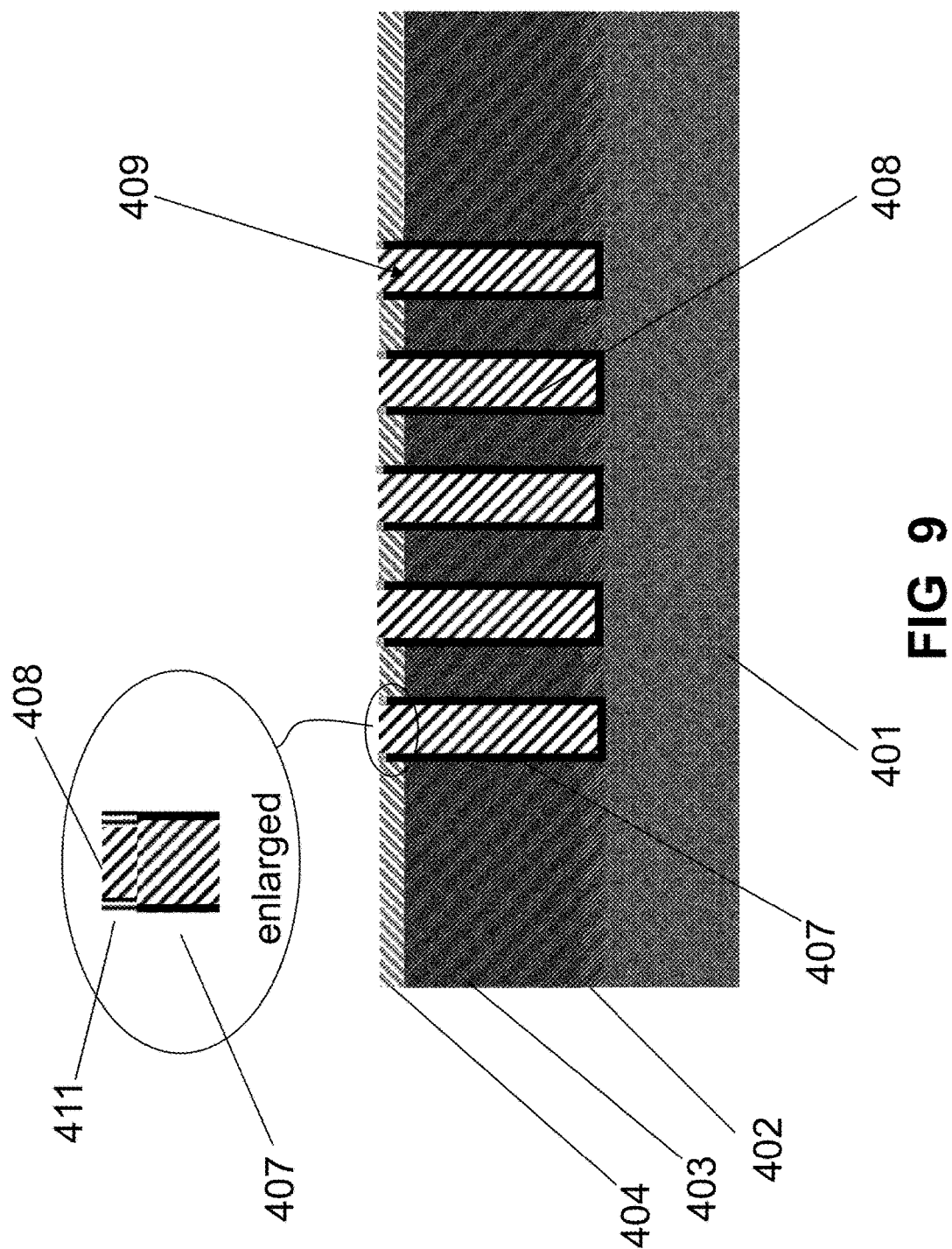
FIG. 9 is a cross-sectional view illustrating the interconnection structure according to embodiment one after the reducing gas is introduced.

FIG. 9 is a cross-sectional view illustrating the interconnection structure in embodiment one after the reducing gas is introduced in Step 305. The top surface of the metal layer 408 should be Cu instead of copper surface oxide, so the metal surface oxide 412 need to process. In Step 305, a reducing gas is introduced to the processing chamber to reduce the metal surface oxide 412. The reducing gas is a mixed gas of $N_2$ and $H_2$, and the ratio of $H_2$ is below 4% for safety. After the reducing gas is introduced to the processing chamber, the metal surface oxide 412 is reduced to Cu. The barrier surface oxide 411 still exists on top of the barrier layer 407 on sidewall after the reducing gas is introduced, but it has little impact on follow-up processes.

FIG. 10 to FIG. 16 show the method and the interconnection structure according to embodiment two of the present invention.

Figure 10:
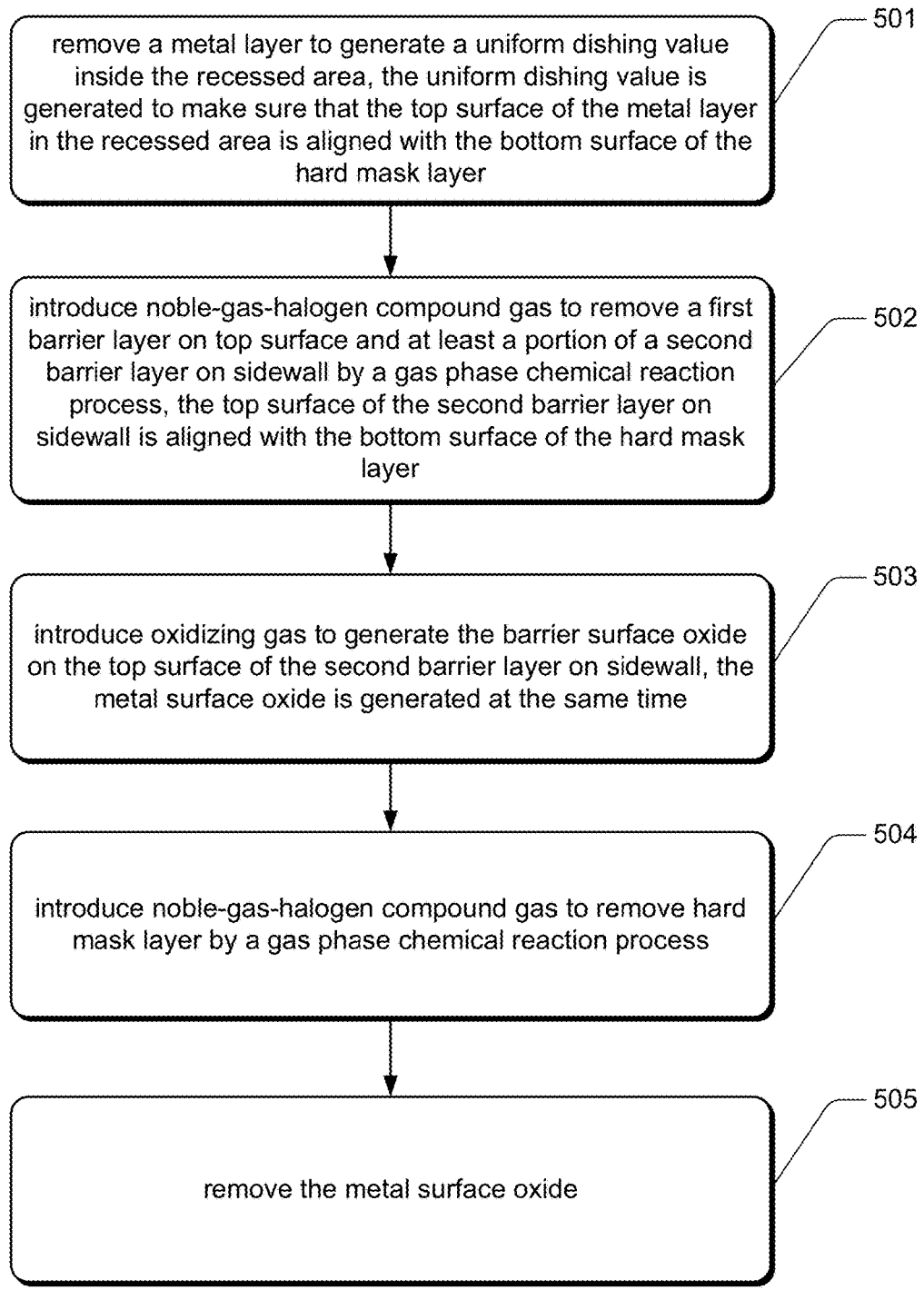
FIG. 10 is a flow chart illustrating the method according to embodiment two for processing an interconnection structure for minimizing barrier sidewall recess.

FIG. 10 is a flow chart illustrating the method for processing an interconnection structure for minimizing barrier sidewall recess. The method comprises the following steps:

Step 501: remove the metal layer 608 to generate a uniform dishing value inside the recessed area 609, the uniform dishing value is generated to make sure that the top surface of the metal layer 608 in the recessed area 609 is aligned with the bottom surface of the hard mask layer 605;

Step 502: introduce noble-gas-halogen compound gas to remove a first barrier layer 606 on top surface and at least a portion of a second barrier 607 layer on sidewall by a gas phase chemical reaction process, the top surface of the second barrier 607 layer on sidewall is aligned with the bottom surface of the hard mask layer 605;

Step 503: introduce oxidizing gas to generate the barrier surface oxide 611 on the top surface of the second barrier layer 607 on sidewall, the metal surface oxide 612 is generated at the same time;

Step 504: introduce noble-gas-halogen compound gas to remove hard mask layer 605 by a gas phase chemical reaction process;

Step 505: remove the metal surface oxide 612.

Figure 11:
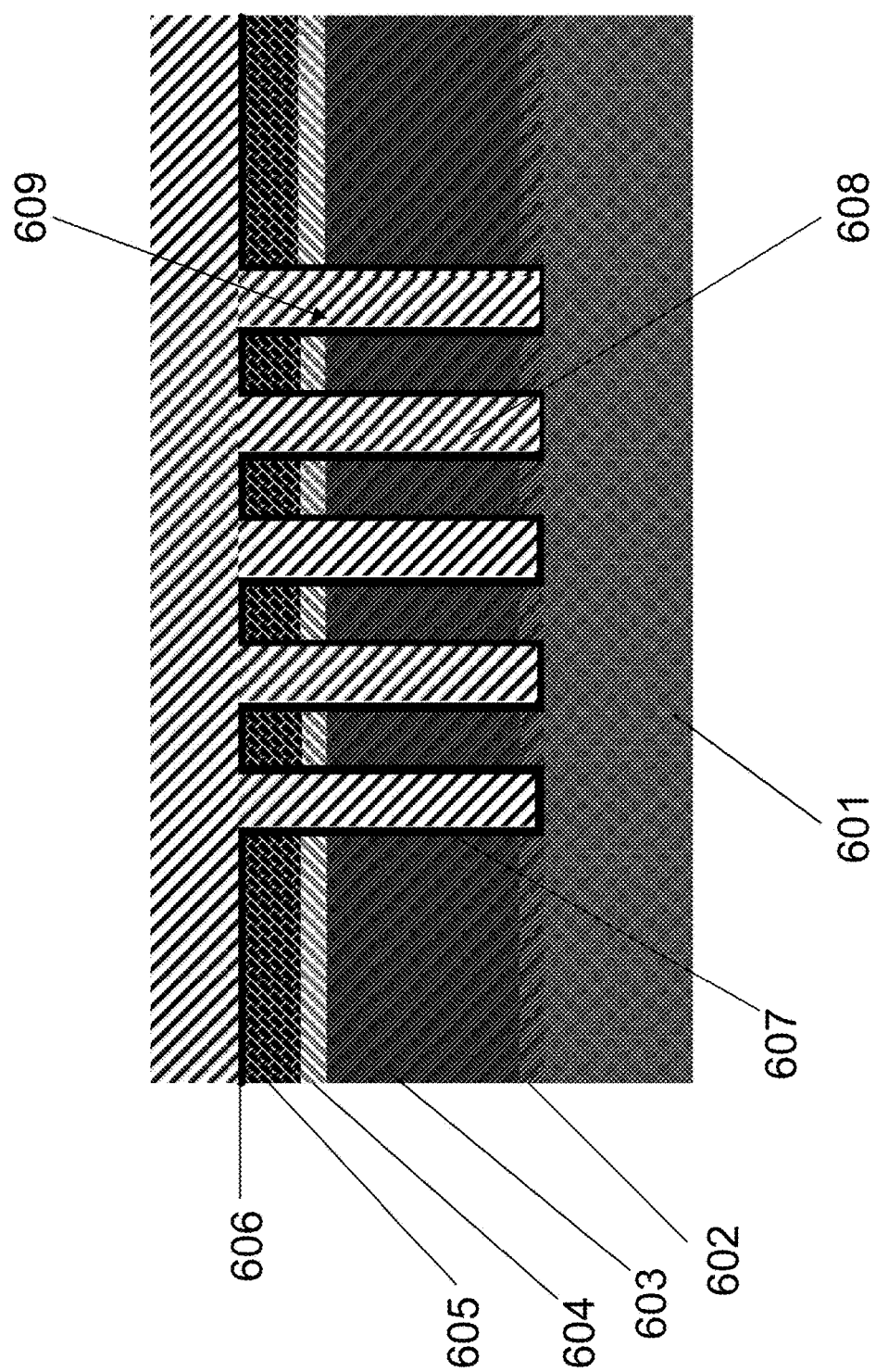
FIG. 11 is a cross-sectional view illustrating the interconnection structure according to embodiment two.

FIG. 11 shows the cross-sectional view of the interconnection structure in embodiment two. Referring to FIG. 11, from bottom to top, the interconnection structure includes a substrate 601, an isolation layer 602, a first dielectric layer 603, a second dielectric layer 604, a hard mask layer 605 and a barrier layer. The interconnection structure further comprises a metal layer 608 above the barrier layer and inside a recessed area 609. The first dielectric layer 603 is a low k dielectric layer. The second dielectric layer 604 is a layer of TEOS. And the barrier layer could be defined as the first barrier layer 606 on top surface and the second barrier layer 607 on sidewall. It is known that the barrier layer is used for preventing the metal from diffusing into the low k dielectric materials in the interconnection structure. The first barrier layer 606 on top surface, as well as the second barrier layer 607 on sidewall are two layers of Ta and TaN. In other embodiments, the material of the barrier layer could be Ru, Co, etc. The hard mask layer 605 is a layer of TiN. The metal layer 608 above the barrier layer and inside the recessed area is a layer of Cu.

Figure 12:
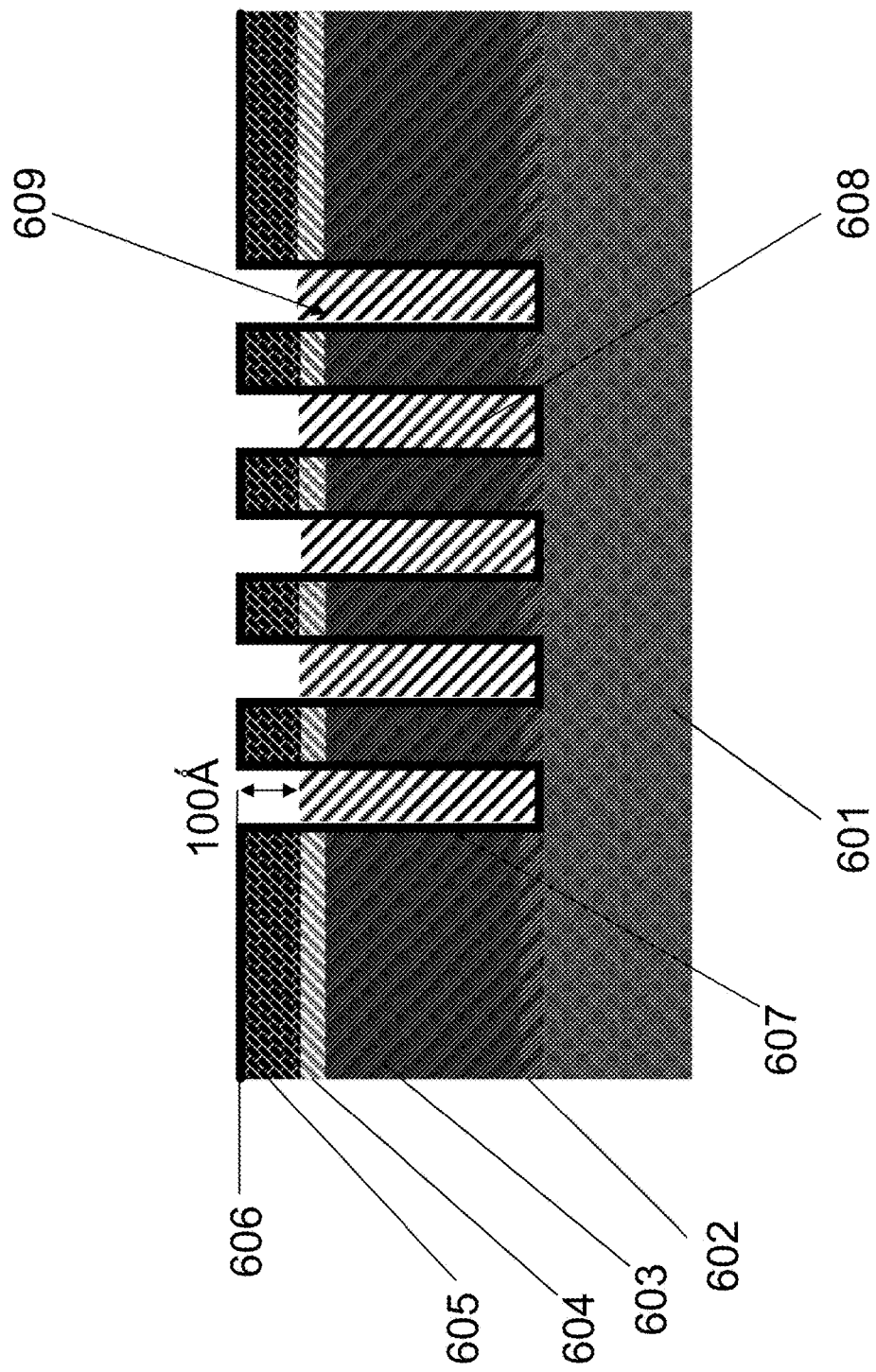
FIG. 12 is a cross-sectional view illustrating the interconnection structure according to embodiment two after the uniform dishing value is generated.

FIG. 12 is a cross-sectional view illustrating the interconnection structure after the uniform dishing value is generated. Since the dishing value in this embodiment is not very large, the metal layer 608 in the recessed area 609 is also removed by CMP process in Step 501. The metal layer 608 in the recessed area is removed by CMP process, but the barrier layer is not, so a uniform dishing value is generated inside the recessed area 609. This dishing value could be from 0 to 100, depending on the thickness of the barrier layer and the hard mask layer. It is preferred that the top surface of the metal layer 608 in the recessed area 609 is aligned with the bottom surface of the hard mask layer 605. In this embodiment, the dishing value in each recessed area 609 is 100Å, and the top surface of the metal layer 608 in the recessed area 609 is aligned to the bottom surface of hard mask layer 605. In other words, the top surface of the metal layer 608 in the recessed area 609 is aligned to the top surface of the second dielectric layer 604. Since the uniform dishing is generated, the second barrier layer 607 on sidewall is divided into two parts by the top surface of the rest of the meta layer 608: the upper part and the lower part. The upper part of the second barrier layer 607 on sidewall is exposed after CMP process, and the lower part of the second barrier layer 607 on sidewall remains non-exposed. So both the exposed barrier layer 606 on top surface and the exposed barrier layer 607 on sidewall need to be removed in the next step.

Figure 13:
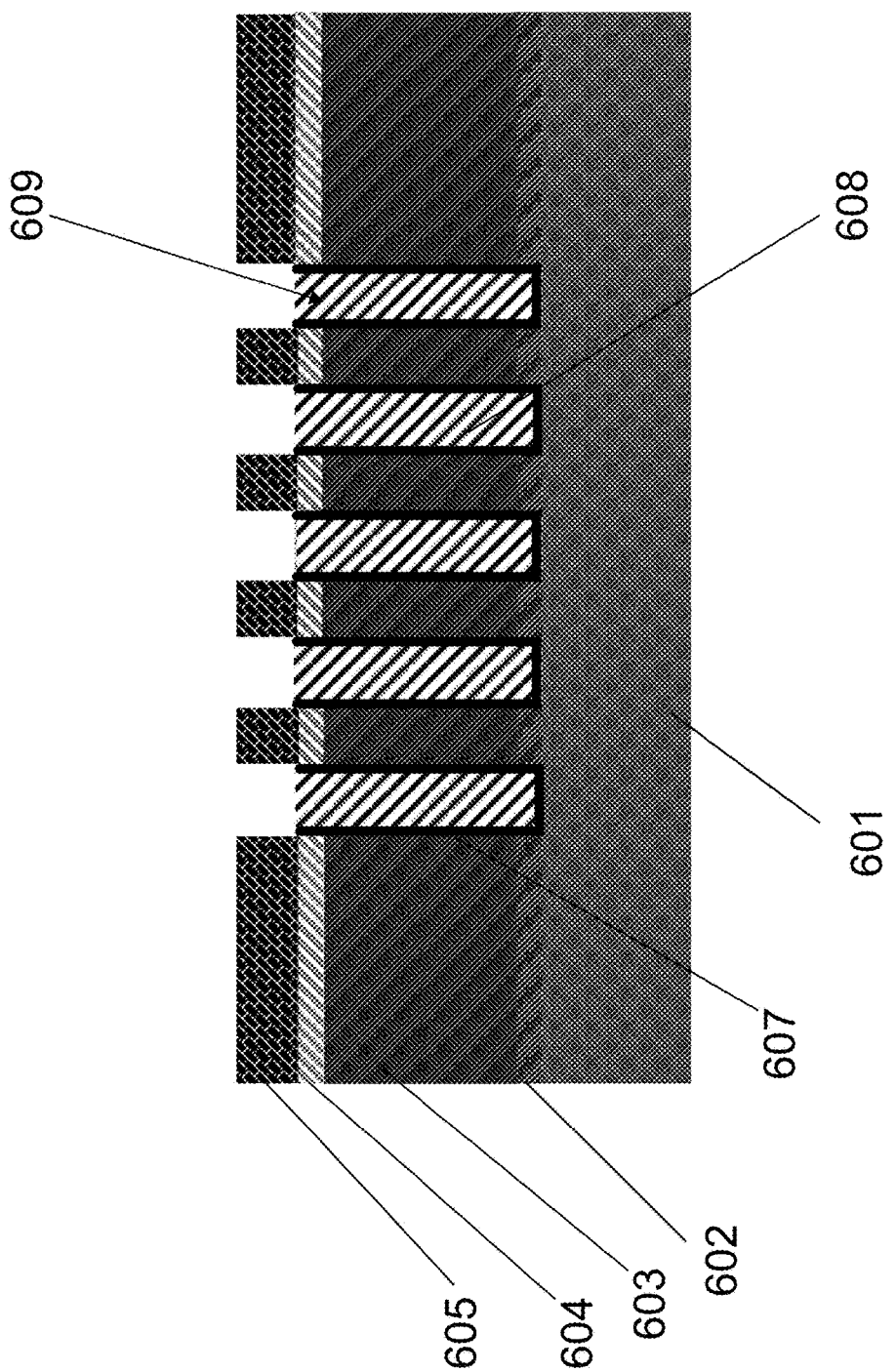
FIG. 13 is a cross-sectional view illustrating the interconnection structure according to embodiment two after the exposed barrier layer is removed.

FIG. 13 shows the exposed barrier layer 607 on sidewall and the exposed barrier layer 606 on top surface are removed by the gas phase chemical reaction process in step 502. In this embodiment, the thickness of the second barrier layer 607 on sidewall is thicker than the thickness of the first barrier layer 606 on top surface. Besides, the gas phase chemical reaction process is isotropic, so after the noble-gas-halogen compound gas is introduced to the processing chamber, the upper part of the second barrier layer 607 on sidewall will be removed, but only a portion of the first barrier layer 606 on top surface will be removed. The barrier layer 606 on top surface is not totally removed, so there is some barrier residual on the top surface of the hard mask layer 605. Therefore, not the top surface but the side part of the hard mask layer 605 is exposed. In order to overcome the barrier sidewall recess problem, the gas phase chemical reaction process in Step 502 need to be controlled accurately by an end point control mechanism, so that the exposed barrier layer 607 on sidewall is removed and the non-exposed barrier layer 607 on sidewall is aligned with the bottom surface of the hard mask layer 605. The end point control mechanism, for example, is to control the gas phase chemical reaction process by detecting the variation of reflection rate.

The process conditions of the gas phase chemical reaction process in Step 502 can be set as follows: the operating temperature is from RT(Room temperature) to 400° C., the gas flow rate of the noble-gas-halogen compound gas is from 2 sccm to 100 sccm, the operating pressure is from 5 mTorr to 10 Torr. And the noble-gas-halogen compound gas in Step 502 can be a mixture of at least two of the following: $XeF_2$, $XeF_4$, $XeF_6$ or $KrF_2$. An inert gas, such as Ne or Ar, could also be introduced into the processing chamber with the noble-gas-halogen compound gas as a carrier gas.

In embodiment two, the process conditions of the gas phase chemical reaction process in Step 502 are as follows: the operating temperature is 400° C., the gas flow rate of the noble-gas-halogen compound gas is 100 sccm, the operating pressure is 20 Torr. The the noble-gas-halogen compound gas is $XeF_2$ and $KrF_2$. It takes about 40 s to finish the gas phase chemical reaction process in Step 502 at these certain conditions. Since the $XeF_2$ and $KrF_2$ don't react with neither Cu nor low k materials, the low k layer will not be damaged, and the electrical performance and the life time of the IC device will be enhanced.

Figure 14:
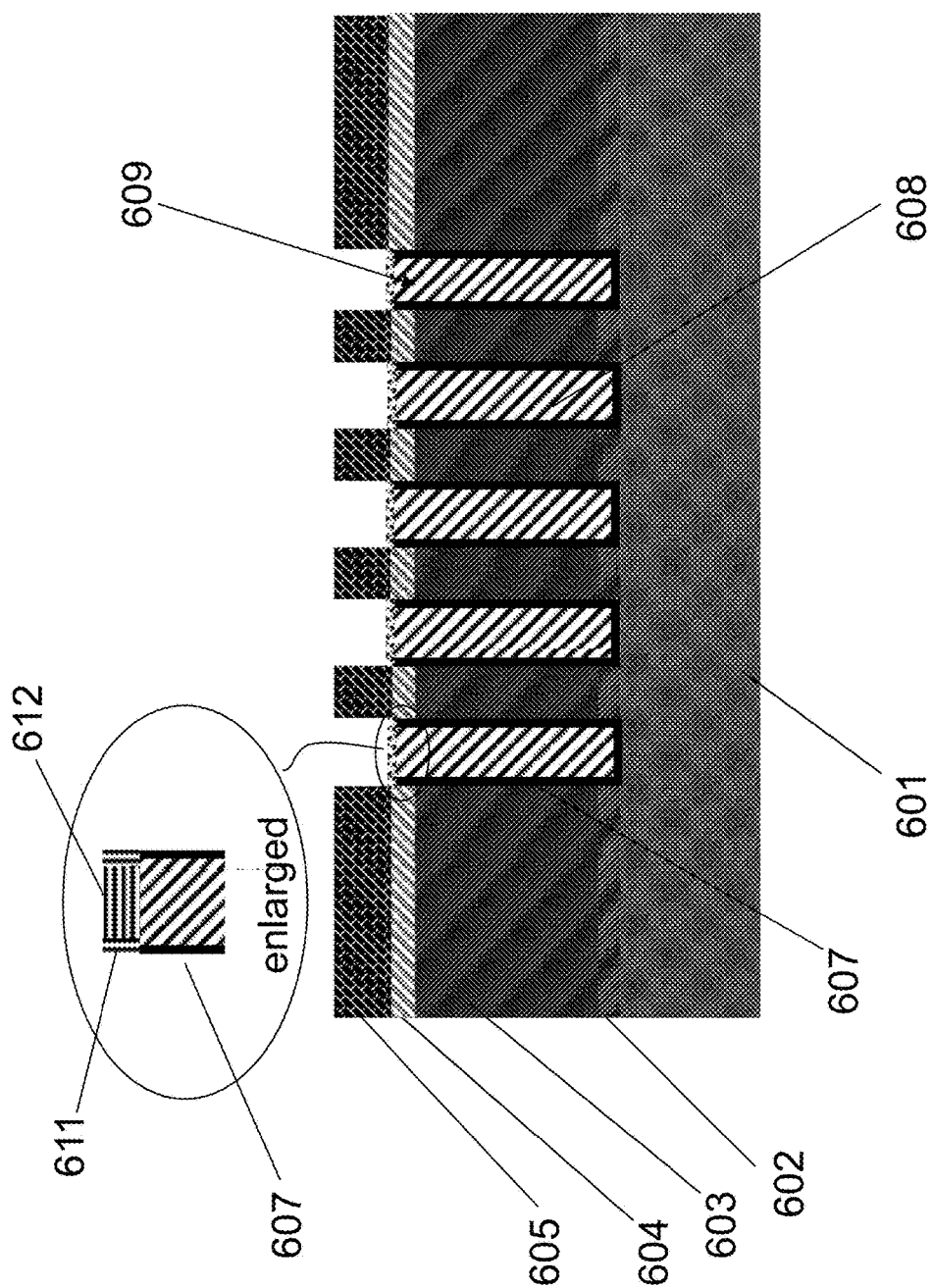
FIG. 14 is a cross-sectional view illustrating the interconnection structure according to embodiment two after the oxidizing gas is introduced.

Referring to FIG. 14. FIG. 14 is a cross-sectional view illustrating the interconnection structure after the oxidizing gas is introduced in Step 503. The oxidizing gas is $O_3$ in this embodiment. In Step 503, after the $O_3$ is introduced into the processing chamber, the top surface of the second barrier layer 607 on sidewall will be oxidized, as well as the top surface of the rest of the metal layer 608 in the recessed area 609. Moreover, the barrier residual on the top surface of the hard mask layer 605 is also oxidized. The barrier surface oxide 611 is generated on top of the second barrier layer 607 on sidewall, and the metal surface oxide 612 is generated at the same time. Both the barrier surface oxide 611 and the metal surface oxide are very thick. The barrier surface oxide 611 is conductive to prevent the second barrier layer 607 on sidewall from being further etched in the next step, so that the barrier sidewall recess will not be generated. The metal surface oxide 612 is copper surface oxide which is undesired, so it will be processed in subsequent steps.

In Step 503, the $O_3$ can be introduced at conditions of the following: the operating temperature is from 150° C. to 400° C., the gas flow rate of the $O_3$ is from 0 to 20 slm, the operating pressure is from 200 Torr to 800 Torr. The operating temperature is important, because there will be no obvious oxidization occurring on the barrier layer if the operating temperature is lower than 150° C. What's more, if the operating temperature is higher than 400° C., the interconnection structure will be damaged by thermo stress. Meanwhile, the oxidization threshold temperature of TiN is 800° C., so the hard mask layer 605 will not be oxidized at current conditions. In this embodiment in Step 504, the $O_3$ is introduced at conditions of the following: the operating temperature is 150° C., the gas flow rate of the $O_2$ is 10 slm, the operating pressure is 200 Torr.

Figure 15:
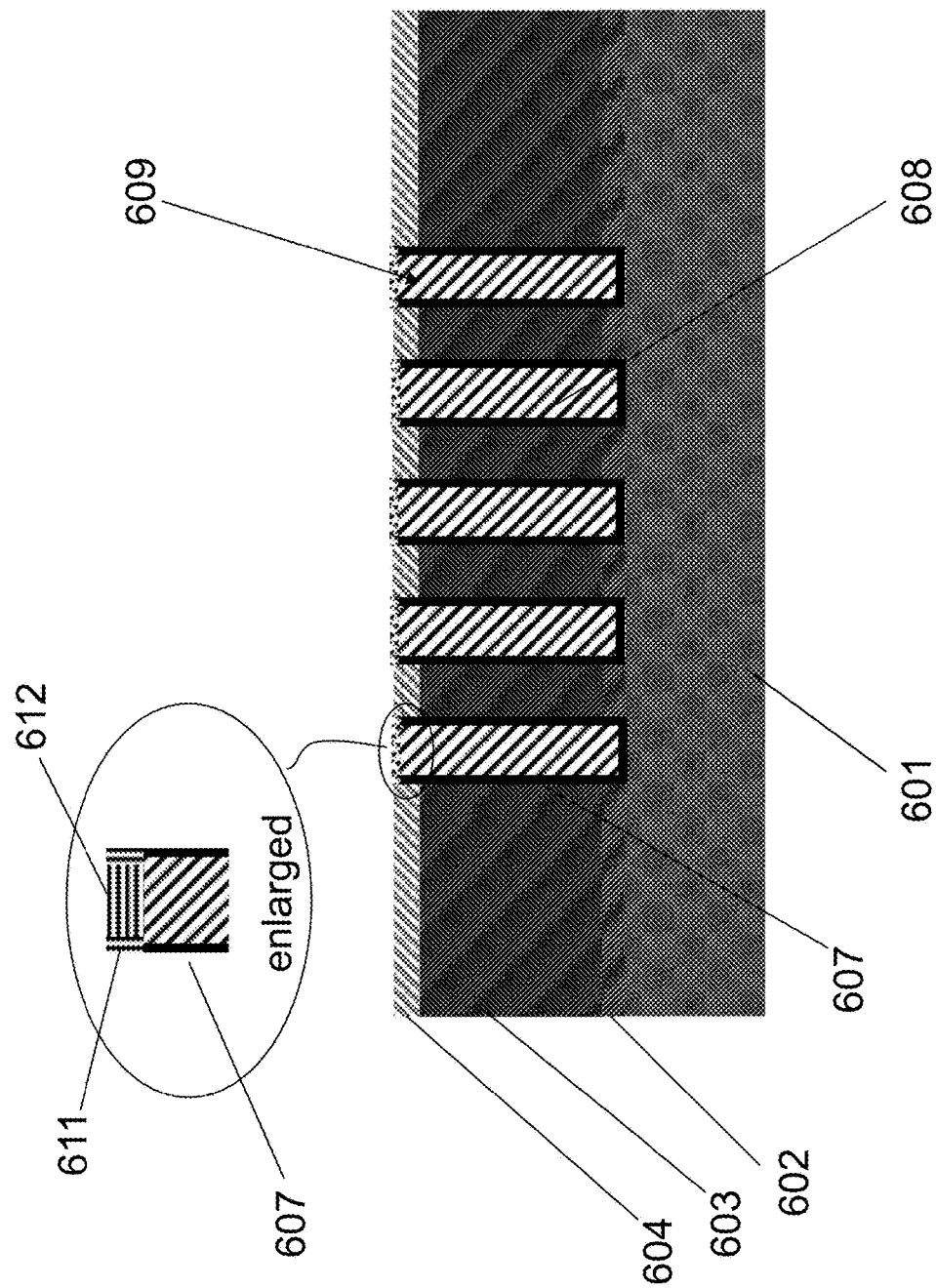
FIG. 15 is a cross-sectional view illustrating the interconnection structure according to embodiment two after the hard mask layer is removed.

FIG. 15 is a cross-sectional view illustrating the interconnection structure in embodiment two after the hard mask layer 605 is removed in Step 504. In Step 504 noble-gas-halogen compound gas is introduced into the processing chamber to remove the hard mask layer 605. The noblegas-halogen compound gas is a mixture of at least two of the following: $XeF_2$, $XeF_4$, $XeF_6$ or $KrF_2$. An inert gas, such as Ne or Ar, could also be introduced into the processing chamber with the noble-gas-halogen compound gas as a carrier gas. Since the top surface of the second barrier layer 607 on sidewall is protected by the barrier surface oxide 611, and the hard mask layer 605 of TiN is not oxidized, so in the end of the gas phase chemical reaction process in Step 504, the hard mask layer 605 will be removed from the side part with the oxided barrier residual by the noble-gas-halogen compound gas. the second barrier layer 607 is not further etched in the gas phase chemical reaction process in Step 504 so that the barrier sidewall recess problem is avoided.

According to the experimental data, there is a positive correlation between the etching rate of TiN and temperature. Therefore, in order to achieve a better effect and etching efficiency, the processing conditions in the gas phase chemical reaction process in Step 504 are a little different from the gas phase chemical reaction process in Step 502. The processing conditions in the gas phase chemical reaction process in Step 504 are as follows: the operating temperature is from 150° C. to 400° C., the gas flow rate of the noble-gas-halogen compound gas is from 2 sccm to 100 sccm, the operating pressure is from 5 mTorr to 20 Torr.

Figure 16:
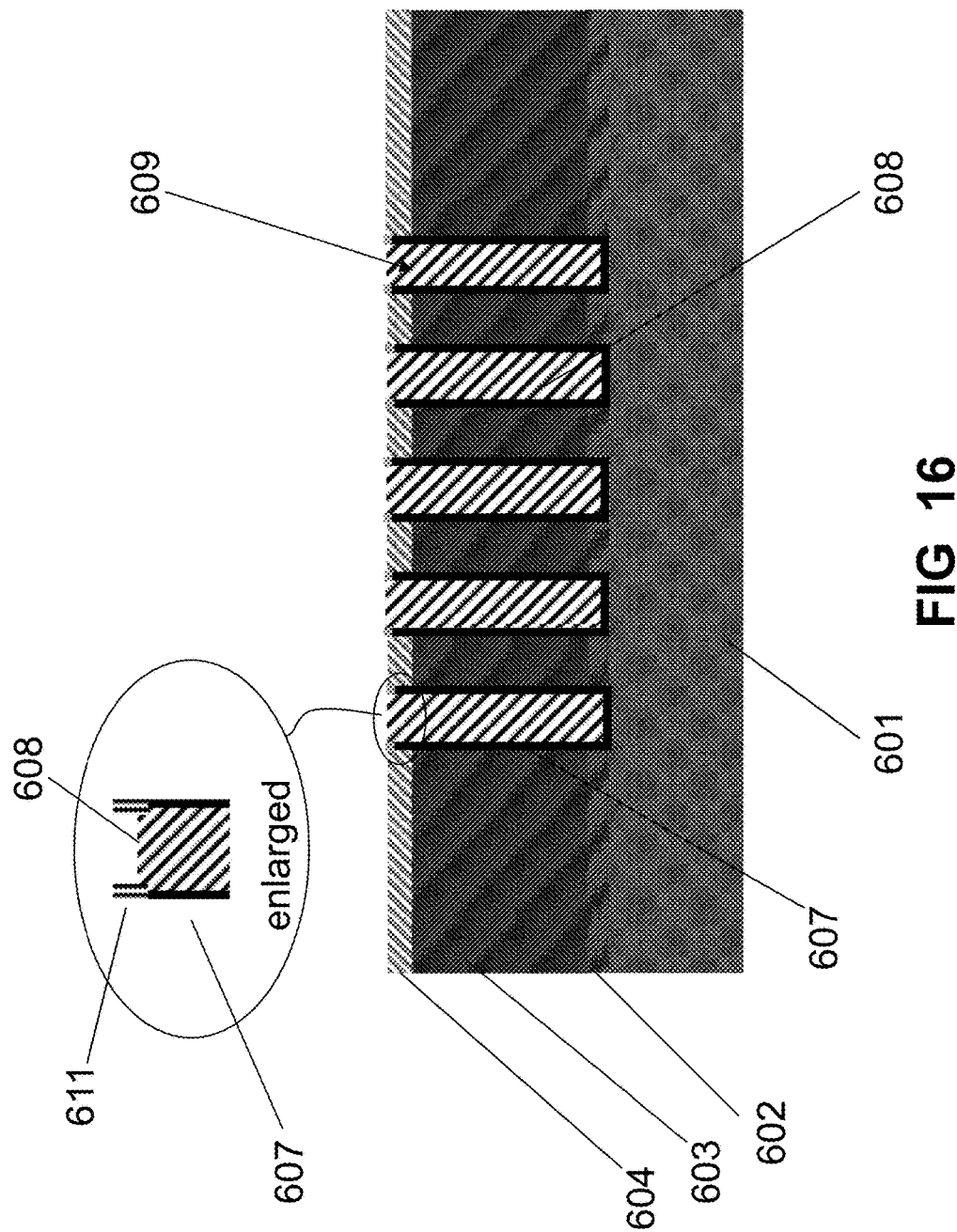
FIG. 16 is a cross-sectional view illustrating the interconnection structure according to embodiment two after the metal surface oxide is removed.

FIG. 16 is a cross-sectional view illustrating the interconnection structure in embodiment two after the metal surface oxide 612 is removed in Step 505. The top surface of the metal layer 608 should be Cu instead of copper surface oxide, so the metal surface oxide 612 need to be further processed. In Step 505, the metal surface oxide 612 is removed by the means of citric acid solution cleaning. The citric acid is diluted with DIW, and the concentration of the citric acid solution is from 1% to 2%. After the citric acid solution cleaning, the metal surface oxide 612 is removed. The barrier surface oxide 611 still exists on top of the second barrier layer 607 on sidewall after the reducing gas is introduced, but it has little impact on follow-up processes.

Figure 17:
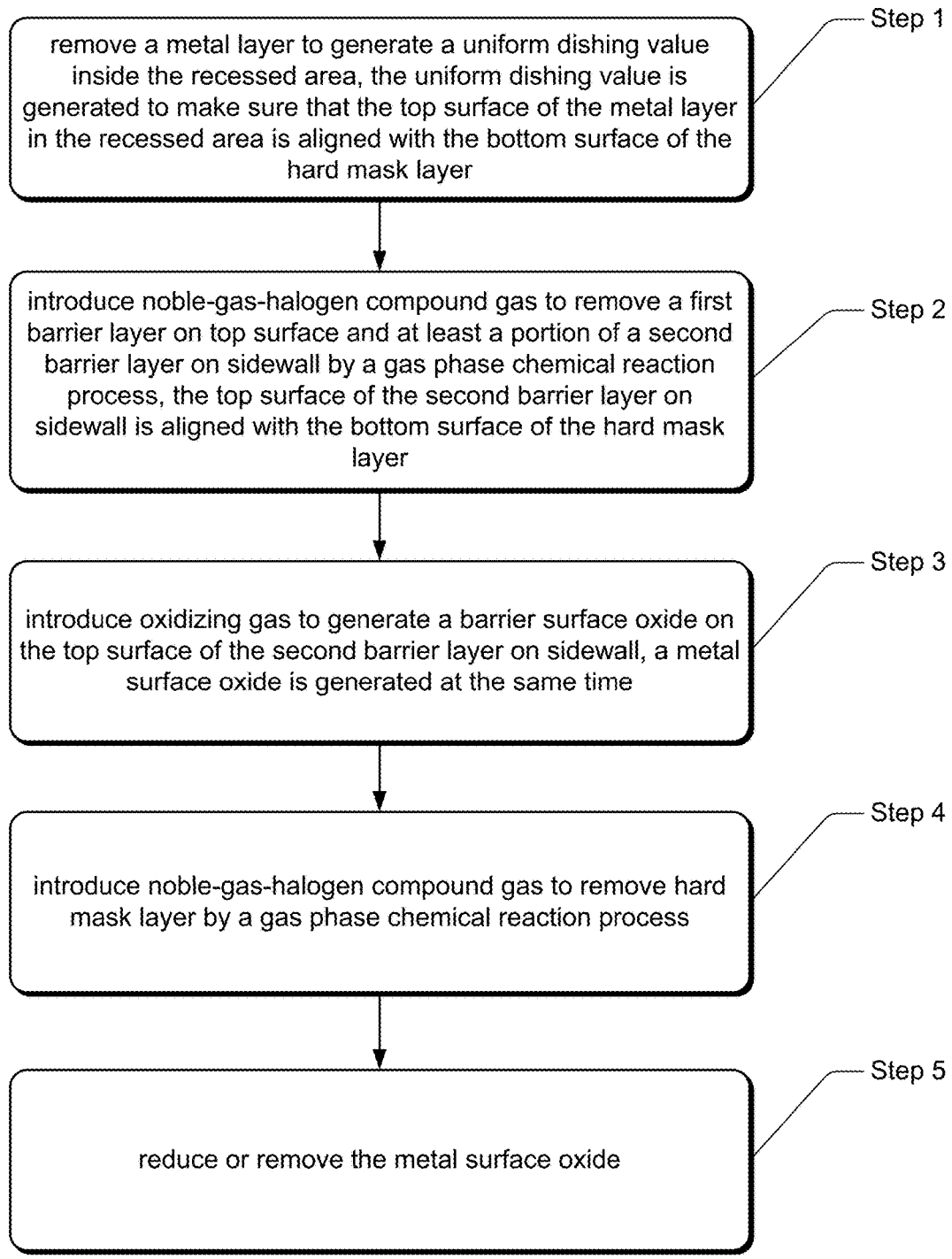
FIG. 17 is a flow chart illustrating the method for processing an interconnection structure for minimizing barrier sidewall recess.

Given the above, a method for processing an interconnection structure for minimizing barrier sidewall recess is disclosed in the present invention. As shown in FIG. 17, the method comprises:

Step 1, remove a metal layer to generate a uniform dishing value inside the recessed area, the uniform dishing value is generated to make sure that the top surface of the metal layer in the recessed area is aligned with the bottom surface of the hard mask layer;

Step 2, introduce noble-gas-halogen compound gas to remove a first barrier layer on top surface and at least a portion of a second barrier layer on sidewall by a gas phase chemical reaction process, the top surface of the second barrier layer on sidewall is aligned with the bottom surface of the hard mask layer;

Step 3, introduce oxidizing gas to generate a barrier surface oxide on the top surface of the second barrier layer on sidewall, a metal surface oxide is generated at the same time;

Step 4, introduce noble-gas-halogen compound gas to remove hard mask layer by a gas phase chemical reaction process;

Step 5, reduce or remove the metal surface oxide.

The foregoing description of the present invention has been presented for purposes of illustration and description. It is not intended to be exhaustive or to limit the invention to the precise form disclosed, and obviously many modifications and variations are possible in light of the above teaching. Such modifications and variations that may be apparent to those skilled in the art are intended to be included within the scope of this invention as defined by the accompanying claims.

The invention claimed is:

1. A method for processing an interconnection structure for minimizing barrier sidewall recess, comprising:
    step 1, removing a metal layer to generate a uniform dishing value inside the recessed area, the uniform dishing value is generated to make sure that the top surface of the metal layer in the recessed area is aligned with the bottom surface of the hard mask layer;
    step 2, introducing noble-gas-halogen compound gas to remove a first barrier layer on top surface and at least a portion of a second barrier layer on sidewall by a gas phase chemical reaction process, the top surface of the second barrier layer on sidewall is aligned with the bottom surface of the hard mask layer;
    step 3, introducing oxidizing gas to generate a barrier surface oxide on the top surface of the second barrier layer on sidewall, a metal surface oxide is generated at the same time;
    step 4, introducing noble-gas-halogen compound gas to remove hard mask layer by a gas phase chemical reaction process;
    step 5, reducing or removing the metal surface oxide.

2. The method of claim 1, wherein the oxidizing gas is $O_2$ or $O_3$.

3. The method of claim 2, wherein in step 3, the $O_2$ or $O_3$ is introduced at conditions of the following: the operating temperature is from 150° C. to 400° C., the gas flow rate of the $O_2$ is from 0 to 20 slm, the operating pressure is from 200 Torr to 800 Torr.

4. The method of claim 1, wherein the noble-gas-halogen compound gas is one of the following: $XeF_2$, $XeF_4$, $XeF_6$ or $KrF_2$.

5. The method of claim 1, wherein the noble-gas-halogen compound gas is a mixture of at least two of the following: $XeF_2$, $XeF_4$, $XeF_6$ or $KrF_2$.

6. The method of claim 1, wherein the material of the barrier layer is a layer of Ta, TaN, Ru, Co, W, WN, Hf; or a combination of two different layers of the above.

7. The method of claim 1, wherein the material of the hard mask layer is a layer of TiN.

8. The method of claim 1, wherein the gas phase chemical reaction process is controlled by an end point control mechanism.

9. The method of claim 1, wherein the dishing value is within a range of 0Å to 1000Å.

10. The method of claim 1, wherein in step 2, the process conditions of the gas phase chemical reaction process are as follows: the operating temperature is from RT to 400° C., the gas flow rate of the noble-gas-halogen compound gas is from 2 sccm to 100 sccm, the operating pressure is from 5 mTorr to 20 Torr.

11. The method of claim 1, wherein in step 4, the process conditions of the gas phase chemical reaction process are as follows: the operating temperature is from 150° C. to 400° C., the gas flow rate of the noble-gas-halogen compound gas is from 2 sccm to 100 sccm, the operating pressure is from 5 mTorr to 20 Torr.

12. The method of claim 1, wherein in step 5, the metal surface oxide is reduced by a reducing gas.

13. The method of claim 1, wherein in step 5, the metal surface oxide is removed by the means of citric acid solution cleaning.

14. The method of claim 13, wherein in step 6, the citric acid is diluted with DIW, and the concentration of the citric acid solution is from 1% to 2%.

* * * * *